United States Patent [19]

Maloy et al.

[11] Patent Number: 4,546,897
[45] Date of Patent: Oct. 15, 1985

[54] INERT ATMOSPHERE TRANSFER VESSEL

[75] Inventors: Joseph T. Maloy, West Orange, N.J.; John F. Leonard, Xenia; David H. Fritts, Dayton, both of Ohio

[73] Assignee: The United States of America as represented by the Secretary of the Air Force, Washington, D.C.

[21] Appl. No.: 657,100

[22] Filed: Oct. 2, 1984

[51] Int. Cl.⁴ .............................................. B65D 17/42
[52] U.S. Cl. ................... 220/277; 250/49.5; 414/217
[58] Field of Search .............. 220/260, 277, 267, 207, 220/203, 300; 250/49.5 B, 49.5 A, 442; 414/217, 222, 225; 73/864, 81

[56] References Cited

U.S. PATENT DOCUMENTS

| | | | |
|---|---|---|---|
| 3,195,355 | 7/1965 | Boyer et al. | 73/422 |
| 3,235,123 | 2/1966 | Frankenberg | 220/267 |
| 3,720,829 | 3/1973 | Palmberg | 250/49.5 |
| 3,958,124 | 5/1976 | Koch et al. | 250/442 |
| 4,411,575 | 10/1983 | Miller | 414/217 |
| 4,469,249 | 9/1984 | Malpas et al. | 220/277 |

Primary Examiner—George T. Hall
Attorney, Agent, or Firm—Donald J. Singer; Bobby D. Scearce

[57] ABSTRACT

A novel hermetically sealed, protective atmosphere transfer vessel is described which comprises a container defining an interior cavity and opening thereof for receiving a sample to be protected during transfer, an annular lip surrounding the opening for receiving a flexible puncturable membrane stretched across the opening for hermetically sealing the container, and a wire puncture bridge attached at one to the container and having at the other end a point positioned near the membrane whereby pressure internal of the container expands the membrane against the point to puncture and tear away the membrane for exposure of the sample. An alternative embodiment includes a lid for the container including an axial exhaust hole therethrough and a ball valve for sealing the exhaust hole under the influence of external pressure on the lid.

8 Claims, 4 Drawing Figures

INERT ATMOSPHERE TRANSFER VESSEL

RIGHTS OF THE GOVERNMENT

The invention described herein may be manufactured and used by or for the Government of the United States for all governmental purposes without the payment of any royalty.

BACKGROUND OF THE INVENTION

The present invention relates generally to containers for the protection of samples, specimens and the like during transfer from one controlled environment to another, and more particularly to an improved transfer vessel wherein the protective cover for the vessel may be removed to expose the sample contained therein, without handling, inside a vacuum transfer box.

The present invention provides an improved transfer vessel for providing protective containment of a sample under a controlled (e.g., inert) atmosphere during transit from a sampling environment such as one which characterizes a glove box or the like, to the controlled atmosphere of an analytical instrument, such as a scanning electron microscope. One embodiment of the transfer vessel of the present invention comprises a metallic cup for containing the sample requiring protectve containment during transit; the top edge of the cup defining an opening for the cup includes a lip for receiving a disposable rubber finger cot or other flexible, puncturable membrane for hermetically sealing the sample within the cup; a wire puncture bridge is supported by the cup and maintained in a predetermined position by a set screw, whereby a reduced pressure external of the vessel (e.g., in a vacuum pass box) causes the cot to expand outwardly against the puncture bridge and to tear away to expose the sample for examination.

In another embodiment of the invention, a lid for the transfer vessel is provided with a check valve for maintaining a protective atmosphere under reduced pressure within the vessel and a spring for interconnecting the lid and a connecting post within a vacuum transfer box of the analytical instrument or other receiving enclosure, whereby the lid may be removed from the vessel to expose the sample without direct handling.

It is, therefore, a principle object of the present invention to provide a simple and reliable transfer vessel for protecting sensitive substances during transfer from one controlled environment to another.

It is a further object of the invention to provide a protective transfer vessel having a cover which is removable without direct handling.

It is a further object of the invention to provide a transfer vessel having a protective atmosphere for use in conjunction with an analytical instrument such as a scanning electron microscope.

These and other objects of the present invention will become apparent as the detailed description of certain representative embodiments thereof proceeds.

SUMMARY OF THE INVENTION

In accordance with the foregoing principles and objects of the present invention, a novel hermetically sealed, protective atmosphere transfer vessel is described which comprises a container defining an interior cavity and opening thereof for receiving a sample to be protected during transfer, an annular lip surrounding the opening for receiving a flexible puncturable membrane stretched across the opening for hermetically sealing the container, and a wire puncture bridge attached at one to the container and having at the other end a point positioned near the membrane whereby pressure internal of the container expands the membrane against the point to puncture and tear away the membrane for exposure of the sample. An alternative embodiment includes a lid for the container including an axial exhaust hole therethrough and a ball valve for sealing the exhaust hole under the influence of external pressure on the lid.

DESCRIPTION OF THE DRAWINGS

The present invention will be more clearly understood from the following detailed description of certain representative embodiments thereof read in conjunction with the accompanying drawings wherein.

DETAILED DESCRIPTION

Figure 1:
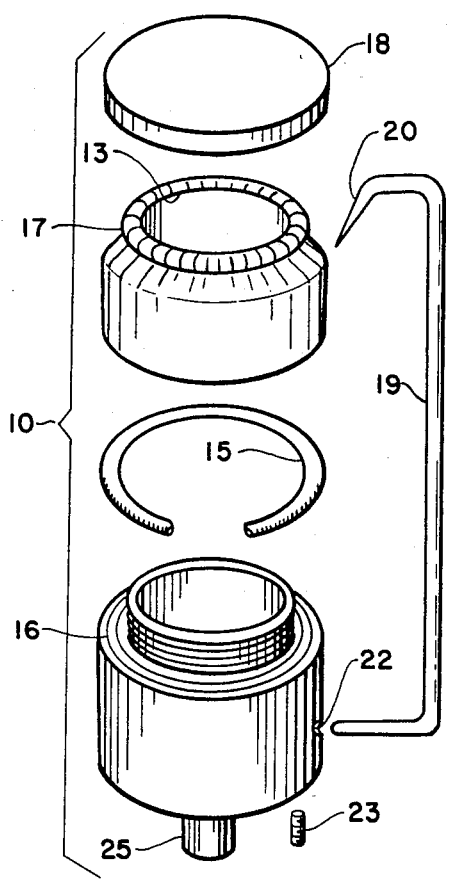
FIG. 1 is an exploded perspective view of the component parts of one embodiment of the transfer vessel of the invention.
Figure 2:
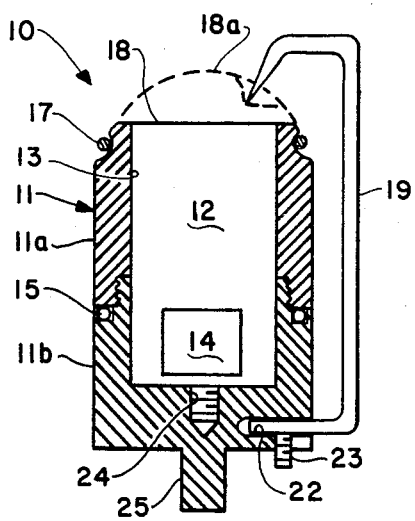
FIG. 2 is an axial sectional view to approximate scale of the assembled FIG. 1 embodiment.

Referring now to the drawings, FIG. 1 presents an exploded view, in perspective, of the component parts of one embodiment of the transfer vessel of the present invention. FIG. 2 presents an axial sectional view to approximate scale of the assembled FIG. 1 embodiment. Transfer vessel 10 generally comprises a hollow container body 11 defining a void volume 12 and opening 13 for receiving, under controlled (e.g., inert) atmosphere, a sample or specimen 14 intended for analytical examination and which must be protected during transfer. Container 11 may comprise two sections 11a and 11b including respective female and male threaded portions for axial assembly as suggested in FIG. 2. A rubber O-ring 15 may be included and sized to fit annular groove 6 in one of the container 11 sections, as suggested in the drawings, for providing a substantial hermetic seal for the assembled container 11.

The circumferential portion of container 11 defining opening 13 includes an annular lip 17 for receiving a rubber finger cot or prophylactic 18. Cot 18 provides a disposable protective diaphragm for vessel 10 and is sized for providing a stretch fit, hermetic seal for container 11 at opening 13. A spring wire puncture bridge 19 is provided for attachment to container 11, extends lengthwise of container 11, and terminates in an inwardly and downwardly (as viewed in FIGS. 1 and 2) sharp pointed end 20. Bridge 19 may be removably attached to container 11 by any suitable means, such as radial hole 22 for snugly receiving one end of bridge 19, and a set screw 23 for firmly holding bridge 19.

For some sample types, such as samples mounted for scanning electron microscope examination, a threaded hole 24 may be provided within container 11, substantially as shown, for receiving a mating fitting for supporting the sample 14. A handling prong 25 in the form of a downwardly extending appendage may be included for ease of handling or mounting during transfer or analysis.

Container 11 (including sections 11a,11b) may comprise any suitable materials of construction. Metal may be preferred for durability and ease of outgassing. Aluminum was used in a unit built in demonstration of the invention.

In the use of the vessel 10 embodiment of FIGS. 1 and 2, a cot 18 is first placed over opening 13 of section 11a of container 11, and this assembly and container section 11b (and O-ring 15 if included) are inserted into the controlled atmosphere chamber, glove box, or the like for loading of sample 14. Once sample 14 is appropriately mounted within section 11b, container 11 is then assembled to seal sample 14 under the controlled (e.g., inert) atmosphere. Container 11 (with cot 18 installed) is then removed to the room environment and puncture bridge 19 is installed as suggested in FIG. 2. Vessel 10 may then be placed into the vacuum pass box of the analytical instrument for evacuation. During the evacuation process, the protective atmosphere within container 11 expands against cot 18, causing it to stretch in manner suggested in FIG. 2 to a position such as indicated at 18a. This presses cot 18 against pointed end 20 of bridge 19, causing puncture and ripping of cot 18 thereby exposing sample 14 for analysis or other intended purpose, without direct handling during the puncture process. Sample 14 is, however, protected by the protective atmosphere during transfer prior to the evacuation procedure.

Figure 3:
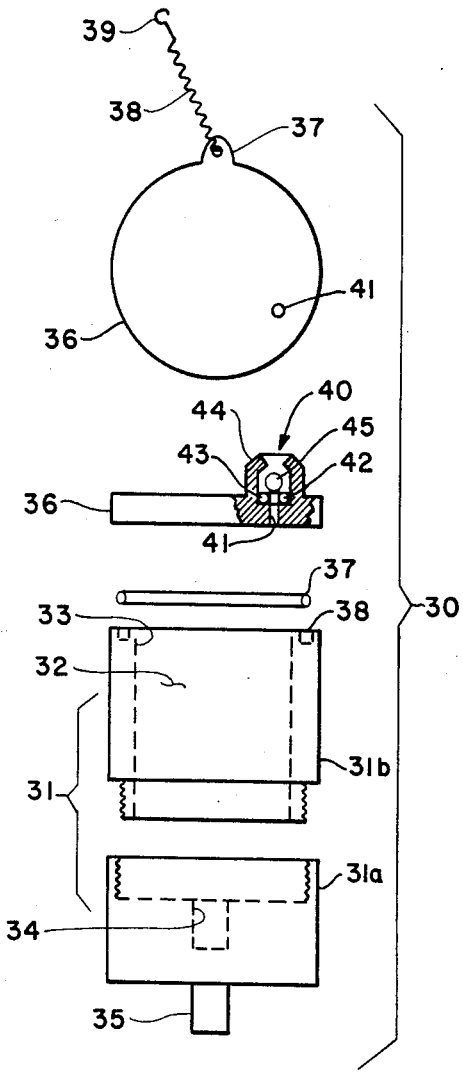
FIG. 3 is an exploded view of another embodiment of the vessel of the present invention incorporating a check valve and spring releasable lid.

Referring now to FIG. 3, shown therein is another embodiment of the novel sample transfer vessel of the present invention using a check valve and spring releasable lid to expose a sample contained therein. In the exploded view of FIG. 3, transfer vessel 30 may comprise a container 31 defining an interior cavity 32 and including axially joinable sections 31a,31b, threaded hole 34, and prong 35 each of equivalent function to similarly named components of the FIGS. 1 and 2 embodiment.

Figure 4:
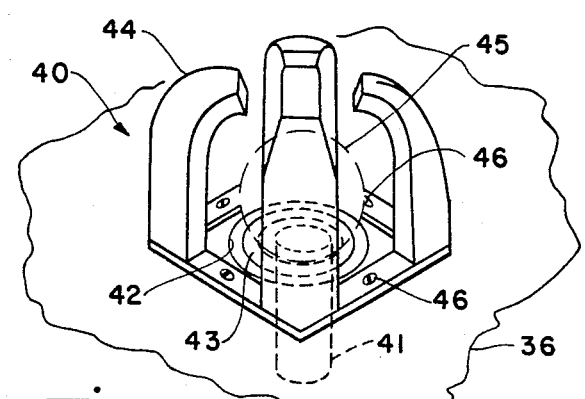
FIG. 4 is a perspective view on enlarged scale of a check valve structure for the FIG. 3 embodiment.

The lid 36 for transfer vessel 30 is disc-shaped and may be sealably attached to section 31b of container 31 using O-ring seal 37 sized to fit groove 38 provided in the upper surface of section 31b and defining opening 33 for container 31. Lid 36 includes a sealing ball arrangement 40 for sealing the interior of vessel 30 against air leakage during sample transfer. The sealing ball arrangement 40 is shown in more detail in FIG. 4. A small exhaust hole 41 is provided axially through lid 36 and includes an enlargement 42 providing a shoulder for seating O-ring 43 around and sealing exhaust hole 41. A cage 44 is provided around exhaust hole 41 for loosely holding sealing ball 45; cage 44 may be secured to lid 36 by suitable means such as screws 36 through the base thereof. A tab 37 is provided on the circumference of lid 36 for attaching a spring 38 thereto. Spring 38 has attached at the other end a hook or other attaching means 39 for attachment to a post or other attachment point within the vacuum transfer box of the analysis instrument.

In the use of vessel 30 for the transfer of a sample enclosed therein under a protective atmosphere, the various component parts of vessel 30 are inserted into the controlled atmosphere chamber for the loading of a sample in manner similar to the loading of sample 14 within vessel 10. The sample is placed within container sections 31a,31b, and O-ring 37 and lid 36 are asembled to section as suggested in FIG. 3. The assembled vessel 30 is partially evacuated through the check valve arrangement 40 which produces a partial vacuum within container 31; the external pressure acts on sealing ball 45 to force it against O-ring 43 thereby sealing the interior of vessel 30 against inward air leakage. The partial external pressure also seals lid 36 against O-ring 37 to provide an air-tight seal at the interface of section 31b with lid 36.

Transfer vessel 30 of the FIG. 3 embodiment may be preferable vessel 10 of the FIG. 1 embodiment for the protective transfer of samples intended for scanning electron microscope use. When vessel 30 is placed within the evacuation chamber of the scanning electron microscope, spring 38 with hook 39 may be attached under tension to a suitable post provided therein. Subsequent evacuation reduces the pressure difference holding lid 36 to container member 31 and spring 38 withdraws lid 36 to expose the enclosed sample for analysis.

The present invention therefore provides a unique vessel for transferring air-sensitive substances, samples, or the like, from a controlled atmosphere chamber, such as a glove box, inert gas welding enclosure, or the like, to another controlled atmosphere enclosure such as that included within a scanning electron microscope or other analytical instrument. In either of the specific embodiments described, the substance contained inside the transfer vessel is protected from air exposure or other contamination during transfer. The transfer vessel of the present invention is remarkably simple in use and inexpensive in structure. In the first described embodiment, the finger cot is disposable and provides an inexpensive puncturable seal for sample protection. All other component parts are reuseable. In the embodiment containing the sealing ball arrangement, the invention may be used repetitively without replacement of any component parts. The present invention, therefore, solves the problem of providing simple inexpensive containers for high-vacuum instruments in routine use and may be used to protect sensitive sample material during transfer from the sample preparation area to the analytical instrument.

It is understood that certain modifications to the invention as described may be made, as might occur to one with skill in the field of this invention, within the scope of the appended claims. Therefore, all embodiments contemplated hereunder which achieve the objects of the present invention have not been shown in complete detail. Other embodiments may be developed without departing from the spirit of the invention or from the scope of the appended claims.

We claim:

1. A hermetically sealed vessel for the temporary containment of a sample or the like under protective atmosphere, which comprises:
   a. a container defining a cavity therein and presenting an opening thereinto for receiving said sample;
   b. an annular lip surrounding said opening;
   c. a flexible, puncturable membrane sized for stretching over said annular lip and configured for hermetically sealing said opening thereby; and
   d. a wire bridge configured at one end for attachment to said container, and having a point at the other end positioned near said puncturable membrane whereby pressure internal of said container sufficiently expands said membrane against said point under the influence of reduced pressure external of said container.

2. The vessel as recited in claim 1 wherein said membrane comprises a rubber cot.

3. The vessel as recited in claim 1 wherein said container comprises first and second container members each having respective threaded portions for axially joining said members.

4. A hermetically sealed vessel for the temporary containment of a sample or the like under protective atmosphere, which comprises:
   a. a container defining a cavity therein and presenting a surface defining an opening thereof for receiving said sample;
   b. a lid configured for interfacing said surface for sealing said opening;
   c. an axial hole through said lid; and
   d. a ball valve on said lid near said hole for sealing said hole.

5. The vessel as recited in claim 4 further comprising an annular groove in said surface, and an annular seal, received by said groove for sealing the interface of said lid and surface.

6. The vessel as recited in claim 4 wherein said ball valve includes an elastomeric annular seal on said lid around said hole for sealably receiving said ball under the influence of external pressure on said lid.

7. The vessel as recited in claim 4 wherein said container comprises first and second container members each having respective threaded portions for axially joining said members.

8. The vessel as recited in claim 4 further comprising a spring and wherein said lid includes a tab for attachment thereto of a first end of said spring, the second end of said spring including a hook means for attaching said spring under tension to a point of attachment external of said vessel.

* * * * *